(12) United States Patent
Zhang et al.

(10) Patent No.: US 10,937,767 B2
(45) Date of Patent: Mar. 2, 2021

(54) CHIP PACKAGING METHOD AND DEVICE WITH PACKAGED CHIPS

(71) Applicant: INNO-PACH TECHNOLOGY PTE LTD, Singapore (SG)

(72) Inventors: Wanning Zhang, Shanghai (CN); Deze Yu, Singapore (SG)

(73) Assignee: INNO-PACH TECHNOLOGY PTE LTD, Singapore (SG)

( * ) Notice: Subject to any disclaimer, the term of this patent is extended or adjusted under 35 U.S.C. 154(b) by 0 days.

(21) Appl. No.: 16/480,622

(22) PCT Filed: Mar. 21, 2017

(86) PCT No.: PCT/CN2017/077439
§ 371 (c)(1),
(2) Date: Jul. 24, 2019

(87) PCT Pub. No.: WO2018/137280
PCT Pub. Date: Aug. 2, 2018

(65) Prior Publication Data
US 2019/0385986 A1    Dec. 19, 2019

(30) Foreign Application Priority Data

Jan. 25, 2017 (CN) .......................... 201710061017.1

(51) Int. Cl.
*H01L 21/48* (2006.01)
*H01L 25/07* (2006.01)
(Continued)

(52) U.S. Cl.
CPC ........ *H01L 25/072* (2013.01); *H01L 21/4853* (2013.01); *H01L 21/4871* (2013.01);
(Continued)

(58) Field of Classification Search
CPC .............. H01L 25/072; H01L 21/4853; H01L 21/4871; H01L 21/561; H01L 21/565;
(Continued)

(56) References Cited

U.S. PATENT DOCUMENTS 5,976,912 A * 11/1999 Fukutomi ............. H01L 21/561
438/110
2017/0364726 A1* 12/2017 Buchan ................ G06K 9/0002

FOREIGN PATENT DOCUMENTS

CN      201623107 U    11/2010
CN      102956589 A     3/2013
(Continued)

*Primary Examiner* — Elias Ullah
(74) *Attorney, Agent, or Firm* — Munoy, Geissler, Olds & Lowe, P.C.

(57) ABSTRACT

Disclosed herein are a chip packaging method and a device with packaged chips. The method includes: providing a support plate attached thereon with a first bonding layer; placing a plurality of chips onto the first bonding layer at intervals; performing a plastic packaging process to form a plastic packaging layer filling the gaps between the chips over the support plate, so that the plastic packaged chips are formed; removing the support plate and the first bonding layer to form the plastic packaged chips; forming an insulating layer over the plastic packaged chips, forming openings in the insulating layer and depositing metal in the openings to form a metal conducting layer and an interconnect circuitry; dicing the plastic packaged chips into a plurality of modules. The method reduces the distances between the chips, reduces the size of terminal products, and facilitates the miniaturization of the terminal products.

19 Claims, 5 Drawing Sheets

(51) Int. Cl.
*H01L 21/56* (2006.01)
*H01L 21/78* (2006.01)
*H01L 23/31* (2006.01)
*H01L 23/367* (2006.01)
*H01L 23/538* (2006.01)
*H01L 23/00* (2006.01)
*H01L 25/18* (2006.01)
*H01L 25/00* (2006.01)

(52) U.S. Cl.
CPC .......... *H01L 21/561* (2013.01); *H01L 21/565* (2013.01); *H01L 21/568* (2013.01); *H01L 21/78* (2013.01); *H01L 23/3121* (2013.01); *H01L 23/367* (2013.01); *H01L 23/5381* (2013.01); *H01L 23/5386* (2013.01); *H01L 23/5389* (2013.01); *H01L 24/19* (2013.01); *H01L 24/20* (2013.01); *H01L 24/96* (2013.01); *H01L 25/18* (2013.01); *H01L 25/50* (2013.01); *H01L 2224/214* (2013.01); *H01L 2224/95001* (2013.01); *H01L 2924/1203* (2013.01); *H01L 2924/13055* (2013.01)

(58) Field of Classification Search
CPC ... H01L 21/568; H01L 21/78; H01L 23/3121; H01L 23/5381; H01L 23/5386; H01L 23/5389
USPC ......................................................... 438/107
See application file for complete search history.

(56) References Cited

FOREIGN PATENT DOCUMENTS

| | | |
|---|---|---|
| CN | 103745936 A | 4/2014 |
| CN | 103745958 A | 4/2014 |
| CN | 103915355 A | 7/2014 |
| CN | 105244341 A | 1/2016 |
| CN | 105514071 A | 4/2016 |
| CN | 206639791 U | 11/2017 |
| KR | 100343462 B1 | 7/2002 |

\* cited by examiner

CHIP PACKAGING METHOD AND DEVICE WITH PACKAGED CHIPS

TECHNICAL FIELD

The present invention relates to the technical field of chip package, in particular, to a chip packaging method and a device with packaged chips.

BACKGROUND

An insulated-gate bipolar transistor (IGBT) is a composite full-controlled voltage-driven power semiconductor device comprising a bipolar transistor (BJT) and an insulated gate field effect transistor (GFET) which is also named as metal-oxide semiconductor (MOS), having advantages of both MOS and giant transistors (GTR) in that the IGBT has high input impedance like an MOS and low conducting voltage drop like a GTR. The GTR has low saturation voltage drop and high carrier density but requires a high driving current. On the other hand, the MOS device has low driving power and rapid switching but also has high conducting voltage drop and low carrier density. The IGBT has the advantages of both the devices in that the driving power and the saturation voltage drop are low, for which the IGBT is well suitable to apply to current transform devices operating at a DC voltage of 600 V or higher, such as AC motors, inverters, switching power supplies, lighting circuits, traction driving devices, etc.

FIG. 1 schematically illustrates a conventional IGBT package, which includes: an aluminum silicon carbide (Al-SiC) heat dissipating substrate 1, a first solder layer 2 on the AlSiC heat dissipating substrate 1, a first copper layer 3 on the first solder layer 2, a ceramic layer 4 on the first copper layer 3, a second copper layer 5 on the ceramic layer 4, a second solder layer 6 and a third copper layer 7 which are deposited on the second copper layer 5 and spaced apart from each other, and a diode chip 8 and an IGBT 9 which are deposited on the second solder layer 6 and spaced apart from each other. The diode chip 8, the IGBT 9 and the third copper layer 7 are connected together by wires 10.

The wires 10, usually made of gold, aluminum or copper, tend to be long and possess considerable resistance, and generate undesirable heat converted from electrical energy. To ensure a low electrical resistivity and good performance in heat dissipation, the wires are required to be made thicker than 0.1 mm, generally 0.25 mm. As a result, compared with the normal chips, the distances required for interconnecting the chips to the substrate are large, and the area required for interconnecting a chip to another chip is also large, which enlarges the terminal products.

Therefore, it is in an urgent manner to solve the technical problem of how to provide a packaging method to reduce the distances between the chips so that the size of the terminal products can be reduced.

SUMMARY OF THE INVENTION

An object of the present invention is to provide a chip packaging method and a device with packaged chips, which reduces the distances between chips and finally reduces the size of the terminal products.

The present invention provides a solution which is a chip packaging method, comprising:

(S01) providing a support plate having a first bonding layer attached thereon;

(S02) placing a plurality of chips onto the first bonding layer at intervals;

(S03) performing a plastic packaging process to form a plastic packaging layer filling gaps between the chips over the support plate, so that plastic packaged chips are formed;

(S04) removing the support plate and the first bonding layer;

(S05) forming an insulating layer over the plastic packaged chips, forming openings in the insulating layer, and forming a metal conducting layers and an interconnect circuitry in the openings; and (S06) dicing the plastic packaged chips into a plurality of modules.

The method may further comprises:

(S07) providing a substrate having a plurality of metal pads formed thereon, each metal pad corresponding to a respective one of the chips in the modules;

(S08) forming second bonding layers on the metal pads; and (S09) bonding each of the modules, at a side thereof far away from the insulating layer, to the substrate.

Further, the second bonding layers may be made of a tin-based solder material, wherein in step S09, the module is placed on the substrate by a surface mount system and then processed in a reflow oven so that the module is bonded, at the side thereof far away from the insulating layer, to the substrate.

Further, the second bonding layers may be made of a sintering material, wherein in step S09, the module is placed on the substrate by a surface mount system and then processed in a sintering furnace so that the module is bonded, at the side thereof far away from the insulating layer, to the substrate.

Further, the second bonding layers may be made of an electrically conductive adhesive, wherein in step S09, the module is placed on the substrate by a surface mount system and then baked so that the module is bonded, at the side thereof far away from the insulating layer, to the substrate.

Further, the substrate may be made of metal which is both electrically and thermally conductive.

Further, the support plate may be circular, square or rectangular.

Further, each of the gaps between adjacent one of the chips on the first bonding layer may be greater than or equal to 50 μm.

Further, in step S03, the plastic packaging process may be a high-pressure packaging process or injection molding process, wherein the plastic packaging layer is made of epoxy resin.

Further, the plastic packaging layer may be as thick as the chips.

Further, the plastic packaging layer may be thinner than the chips, wherein the plastic packaging layer has a surface close to the substrate, which is lower than a surface of each of the chips close to the substrate by a distance ranging from 2 μm to 10 μm.

Further, each of the chips may have a front side provided with a circuit and may have a back side provided with an electrode, and each chip is placed with the back side thereof in contact with the first bonding layer.

Further, in step S05, the step of forming the metal conducting layers and the interconnect circuitry may comprise:

sputtering a metal seed layer on the insulating layer;
electroplating portions of the metal seed layer within the openings; and removing the metal seed layer except for the electroplated portions.

Accordingly, the present invention also provides a device with packaged chips, which is formed by the method mentioned above. The device comprises:

a substrate, on which a plurality of second bonding layers are disposed at intervals;

a plurality of chips, each arranged on a corresponding one of the second bonding layers;

a plastic packaging layer, disposed on the substrate and laterally surrounding the chips;

an insulating layer over both the plastic packaging layer and the chips;

openings formed in the insulating layer, each terminating at one of the chips; and a metal conducting layers and an interconnect circuitry, formed in the openings.

Compared with the prior art, the chip packaging method and the device with packaged chips according to the present disclosure have the advantages in that:

1. Plastic packaged chips are formed by arranging a plurality of chips at intervals onto the support plate attached thereon with a first bonding layer, performing a plastic packaging process to form a plastic packaging layer on the support plate, and filing the gaps between the plurality of chips with the plastic packaging layer, so that the distances between the chips can be reduced, and finally the size of the terminal products is reduced, which facilitates miniaturization of the terminal products.

2. According to the present invention, metal is sputtered into the openings in the insulating layer to form a metal seed layer, and the metal seed layer is electroplated so that a metal conducting layer is formed and also an interconnect circuitry between the chips is formed. As a result, the interconnect resistance of the metal in the metal conducting layer is lower than that of the wires in the prior art. Therefore, the energy consumption is reduced and the efficiency of the semiconductor device is improved.

DETAILED DESCRIPTION

The present invention will be described in greater detail below with reference the accompanying drawings so that it will become clearer and easier to understand. Of course, the invention is not limited to the specific embodiments disclosed herein and covers all general substitutions well known to those skilled in the art.

In addition, the schematic drawings, in which the specific embodiments of the invention are illustrated in detail, may not be drawn to scale for the sake of more convenient illustration and understanding, and this is not to be construed as limiting the invention in any sense.

The present invention provides a chip packaging method and a device formed according to the method. The method includes the steps of: providing a support plate attached thereon with a first bonding layer; placing the plurality of chips onto the first bonding layer at intervals; performing a plastic packaging process to form a plastic packaging layer filling the gaps between the chips over the support plate, so that the plastic packaged chips are formed; removing the support plate and the first bonding layer; forming an insulating layer over the plastic packaged chips, forming openings in the insulating layer and depositing a metal in the openings to form a metal conducting layer and an interconnect circuitry between the chips; cutting the plastic packaged chips to form a plurality of modules.

According to the present invention, plastic packaged chips are formed by arranging a plurality of chips at intervals onto the support plate attached thereon with a first bonding layer, performing a plastic packaging process to form a plastic packaging layer on the support plate, and filling the gaps between the plurality of chips with the plastic packaging layer, so that the distances between the chips can be reduced, and finally the size of the terminal products is reduced, which facilitates miniaturization of the terminal products.

Figure 1:
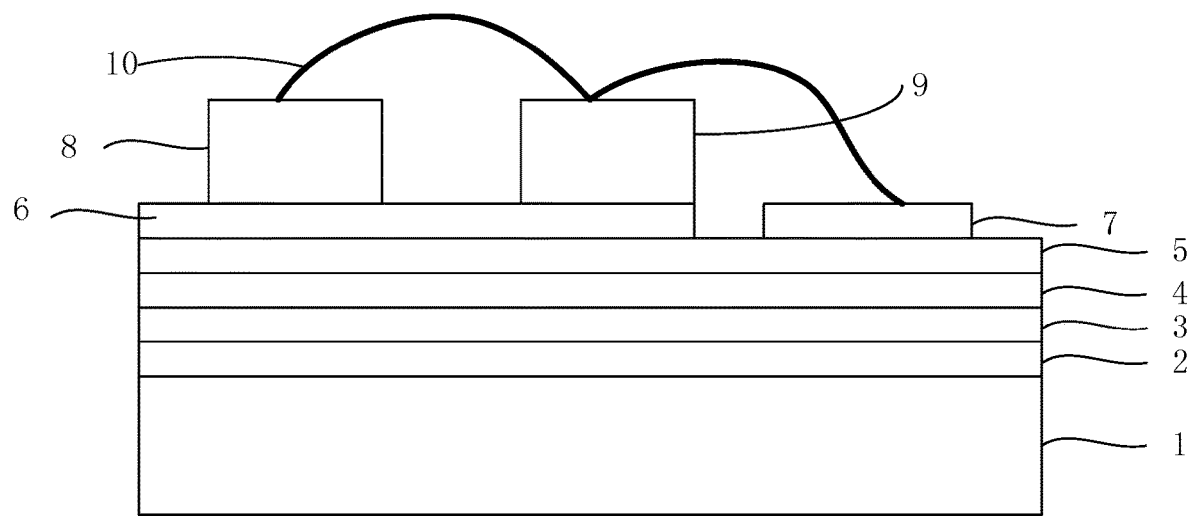
FIG. 1 schematically illustrates a conventional IGBT package.
Figure 2:
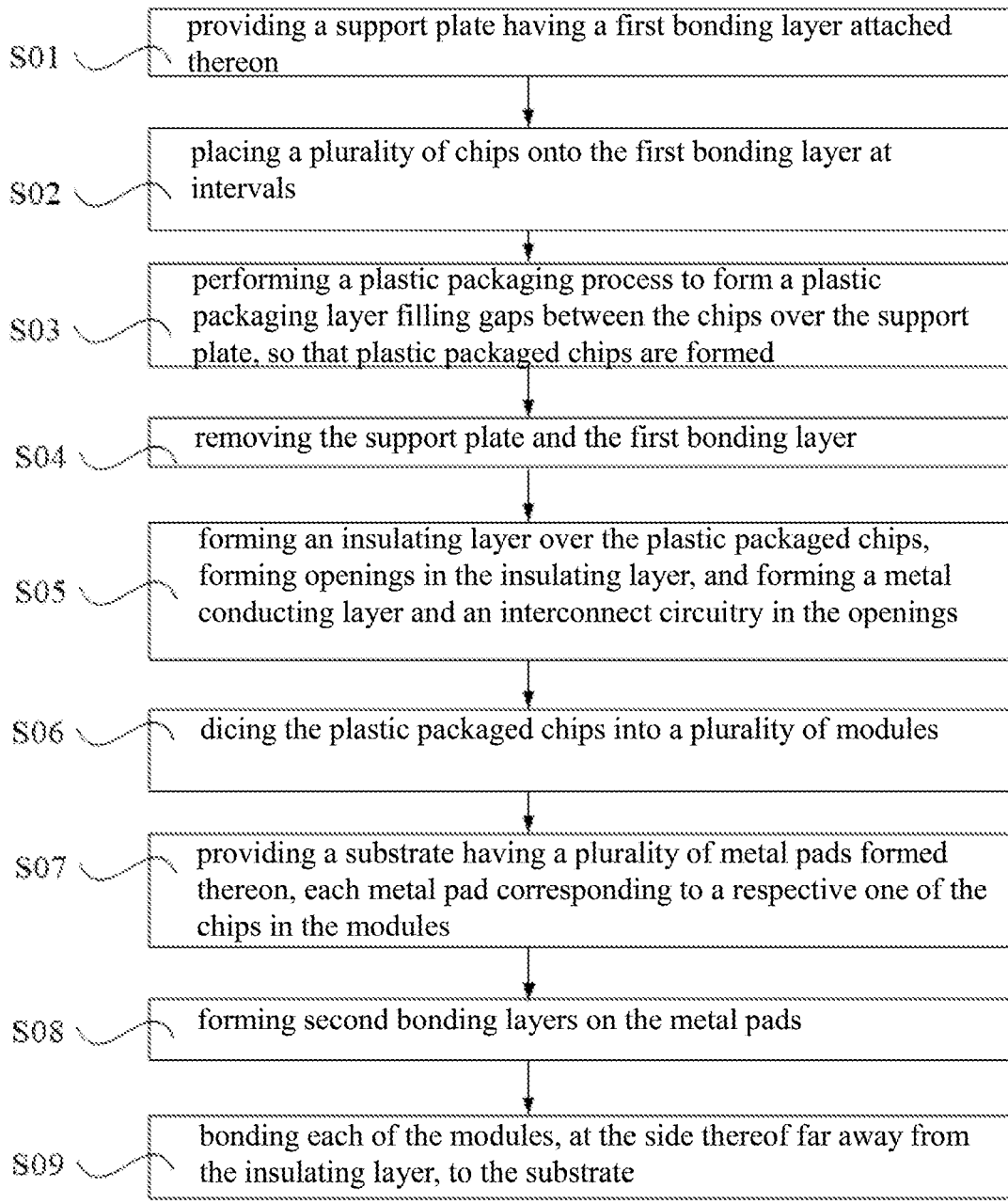
FIG. 2 is a flowchart showing a method for packaging chips according to an embodiment of the present invention.

FIG. 2 is a flowchart showing a method for packaging chips according to an embodiment of the present invention, which includes the steps of:

(S01) providing a support plate attached thereon with a first bonding layer;

(S02) placing the plurality of chips onto the first bonding layer at intervals;

(S03) performing a plastic packaging process to form a plastic packaging layer filling the gaps between the chips over the support plate, so that plastic packaged chips are formed;

(S04) removing the support plate and the first bonding layer;

(S05) forming an insulating layer over the plastic packaged chips, forming openings in the insulating layer and depositing a metal in the openings to form metal conducting layers and an interconnect circuitry between the chips;

(S06) dicing the plastic packed chips into a plurality of modules;

(S07) providing a substrate having a plurality of metal pads formed thereon, each metal pad corresponding to a respective one of the chips in the modules;

(S08) forming second bonding layers on the metal pads; and (S09) bonding each of the modules, at the side thereof far away from the insulating layer, to the substrate.

FIGS. 4 to 12 are schematic illustrations showing structures after each step in a method for packaging chips according to an embodiment of the present invention. The method will be described in detail below with reference to FIGS. 4 to 12 as well as to FIG. 2.

Figure 4:
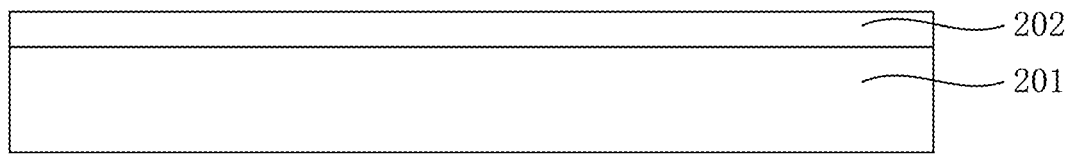
FIGS. 4 to 12 are schematic illustrations showing structures after each step in a method for packaging chips according to an embodiment of the present invention.

In step S01, a support plate 201 is provided, on which a first bonding layer 202 is attached, as shown in FIG. 4.

According to this embodiment, the support plate 201 may assume a circular, square or rectangular shape. The first bonding layer 202 may has a reduced performance in adhesion at a high temperature or when exposed to light.

Figure 5:
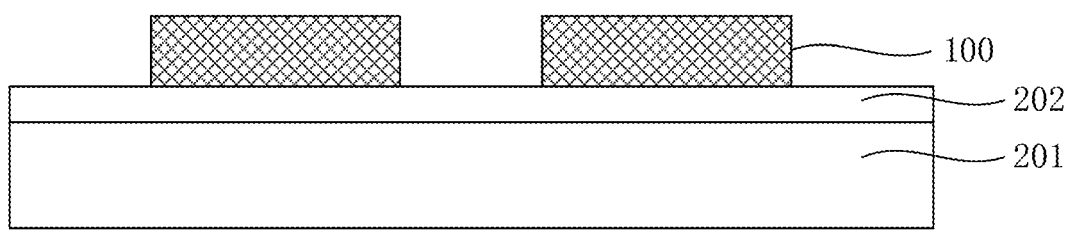

In step S02, the chips 100 are placed onto the first bonding layer 202 at intervals, as shown in FIG. 5. The gap between the adjacent chips 100 may be greater than or equal to 50 µm, for example, 50 µm, 60 µm or 70 µm.

Figure 3:
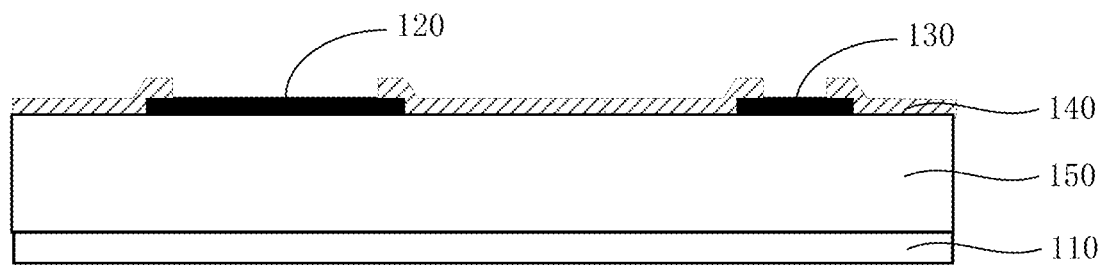
FIG. 3 schematically illustrates a chip according to an embodiment of the present invention.

Each of the chips may have a front side provided with circuits and a back side provided with an electrode, and may be placed on the first bonding layer with the back side in contact therewith. Specifically, FIG. 3 schematically shows such a chip according to an embodiment of the present invention. As illustrated, the chip 100 may include a semiconductor substrate 150 with a front side on which an insulating layer 140 resides. Grooves may be formed in the insulating layer 140, and a metal may be filled in the grooves to form a gate electrode 120 and an emitting electrode 130, which serves as an input end and an output end of the chip 100, respectively. The semiconductor substrate 150 may also have a back side provided thereon with a collector electrode 110. The chip 100 may be placed in an arrangement that the back side is in contact with the first bonding layer. It will be appreciated that the terms "front side" and "back side" are relative terms, and with the orientation shown in FIG. 5 as an example, the side of the semiconductor substrate 150 far away from the first bonding layer 201 is referred to as the front side, and the side thereof closer to the first bonding layer 201 is referred to as the back side.

Figure 6:
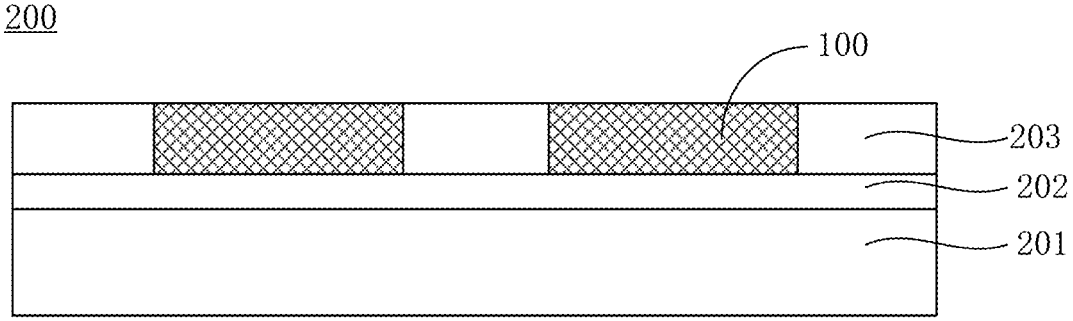

In step S03, a plastic packaging process is performed to form a plastic packaging layer 203 over the support plate 201, and the plastic packaging layer 203 fills the gaps between the chips 100 so that the plastic packaged chips 200 are formed, as shown in FIG. 6.

The plastic packaging process may be a high-pressure packaging process or an injection molding process, and the plastic packaging layer 203 may be made of epoxy resin. Specifically, the chips may be integrally cast with the epoxy resin in the high-pressure packaging process or injection molding process to form the plastic packaged chips. The plastic packaging layer 203 made of epoxy resin may fill the gaps between the chips, in other words, the plastic packaging layer 203 laterally surrounds the chips 100 and is flush with upper surfaces of the chips. Depending on the shape of the support plate 101, the plastic packaged chips may be designed to be circular, square or rectangular. The plastic packaging layer 203 may be as thick as or thinner than the chips 100. For example, the plastic packaging layer 203 may be 2-10 µm thinner than the chips 100, so that the collector electrodes 110 on the back sides of the chips 100 are 2-10 µm higher than the plastic packaging layer 203. The epoxy resin may comprise a polymer material with a low thermal expansion coefficient, and the polymer material may have a volumetric concentration in the range from 7 µm to 9 µm, for example, 7 µm, 8 µm or 9 µm. The thermal expansion coefficient of the polymer material may be lower than $4 \times 10/°C$.

Figure 7:
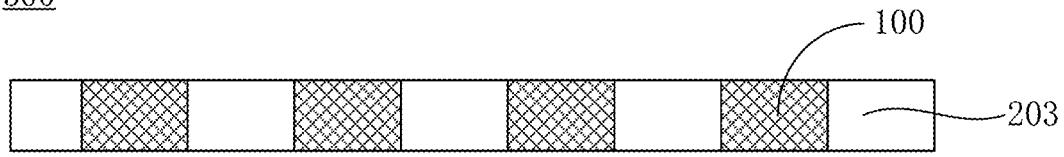

In step S04, the support plate 201 and the first bonding layer 202 are removed so that the plastic packaged chips 300 are formed, as shown in FIG. 7.

The plastic packaged chips 200 may be heated to lower the bonding strength of the first bonding layer 202, thereby allowing the support plate 201 and the first bonding layer 202 to be picked up and taken away by a vacuum chuck, so as to form the plastic packaged chips 300.

Figure 8:
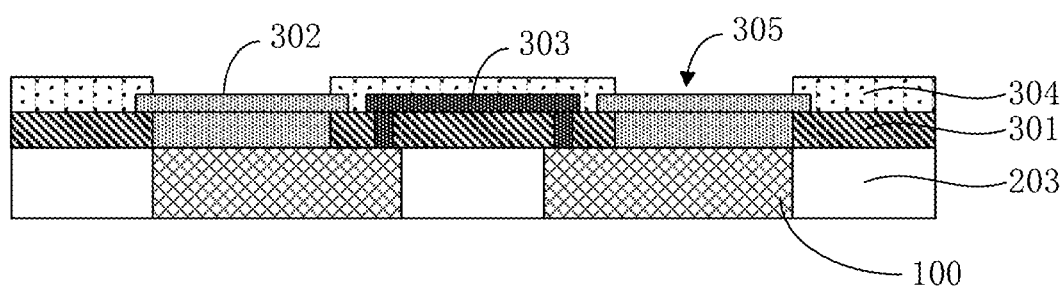

In step S05, an insulating layer 301 is formed over the plastic packaged chips 300, openings are formed in the insulating layer 301, and metal is deposited into the openings to form a metal conducting layer 302 and an interconnect circuitry 303, as shown in FIG. 8.

Specifically, a first insulating layer 301 containing an insulating material, such as an ultraviolet (UV) light sensitive material commonly used in the field of IC packaging, may be coated over the plastic packaged chips 300. After processes of exposure and development, the openings are formed at positions corresponding to the gate and emitter electrodes of the chips 100. The openings may terminate at the upper surfaces of the chips 100.

Subsequently, a metal seed layer has a thickness of 0.2-0.5 µdeposited onto the first insulating layer 301 so that it may be electroplated to form wires.

Subsequently, photoresist may be applied on the metal seed layer and then be exposed and developed to expose the openings and portions of the metal seed layer therein, and the exposed portions of the metal seed layer is electroplated. Thereafter, the photoresist may be removed, and the metal seed layer except for the electroplated portions may be then etched away using an acid, resulting in the formation of the metal conducting layer 302 and the interconnect circuitry 303 between the chips.

A second insulating layer 304 may be further coated onto the structure which is formed after the foresaid processes, and openings 305 may be formed therein at predetermined positions to form interfaces with an external circuitry.

Figure 9:
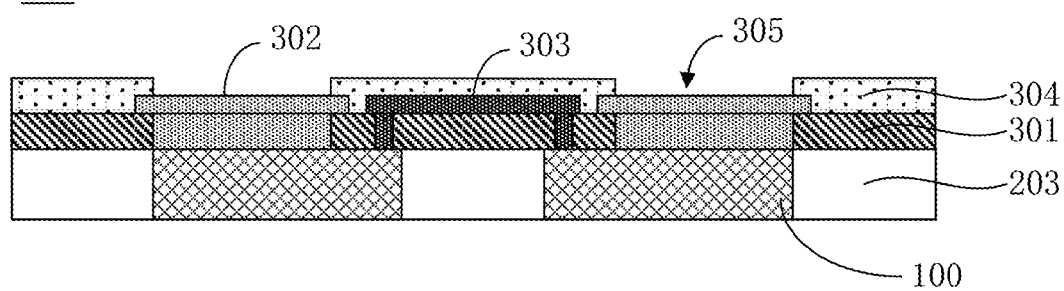

In step S06, a dicing process is carried out to separate the plastic packaged chips into a plurality of modules 400, as shown in FIG. 9. Each of the modules 400 may contain one or more of the chips. In the embodiment continued to be described in the following context, each of the modules 400 contains two chips as an example.

Figure 10:

In step S07, a substrate having a plurality of metal pads formed thereon is provided, and each metal pad corresponds to a respective one of the chips in the modules, as shown in FIG. 10. The substrate 500 may be made of metal which is both electrically and thermally conductive. The metal pads (not shown) are disposed on the substrate 500 in positional correspondence with the respective chips in the module. Therefore, in case the module contains two chips, two metal pads are arranged on the substrate, and the distance between the chips is equal to that between the metal pads.

Figure 11:
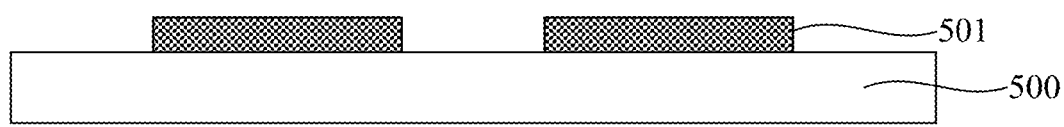

In step S08, second bonding layers 501 are formed on the metal pads, as shown in FIG. 11. The second bonding layers 501 may be formed of a tin-based solder material, a low temperature sintering material, an electrically conductive adhesive or another material known to those skilled in the art.

Figure 12:
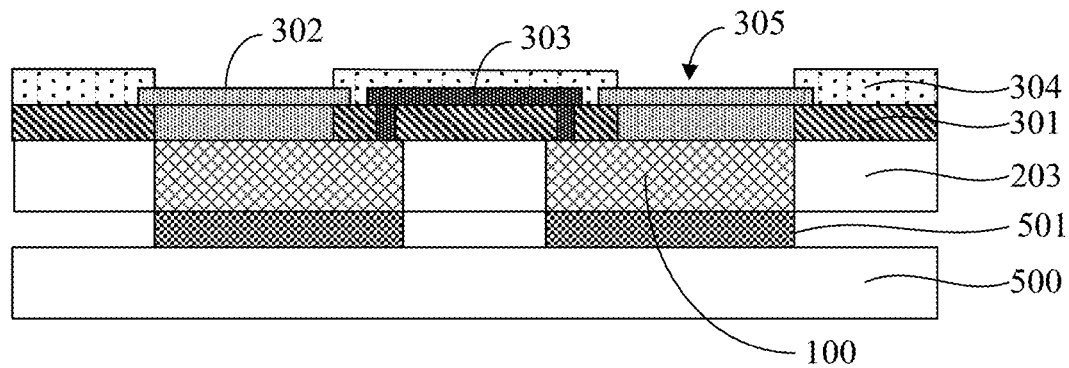

In step S09, the module 400 is attached, at the side far away from the insulating layer, to the substrate 500, resulting in the structure shown in FIG. 12. Specifically, the module 400 may be placed on the substrate 500 by a surface mount system (SMT) in such a manner that the side of the module 400 far away from the insulating layer comes into contact with the second bonding layers 501 on the substrate 500. Subsequently, they may be processed in a reflow oven (in case that the second bonding layers 501 are made of a tin-based solder material) or in a sintering furnace (in case that the second bonding layers 501 are made of a sintering material) or in a baking manner (in case that the second bonding layers 501 are made of an electrically conductive adhesive) to bond the module 400 to the substrate 500, so that the device with packaged chips is formed.

According to the present invention, a plurality of chips 100 are deposited at intervals onto the first bonding layer 202 attached to the support plate 201, the plastic molding layer 203 is formed on the support plate 201 through the plastic packaging process and fills the gaps between the chips 100, so that the plastic packaged chips 200 is formed. As a result, the distances between the chips can be reduced, and thus the size of the terminal products can be reduced, which facilitates miniaturization of the terminal products. Moreover, according to the present invention, metal is sputtered to form the metal seed layer in the openings of the insulating layer, the metal seed layer is electroplated to form a metal conducting layer 302 and an interconnect circuity 303, and the interconnect circuity 303 has a resistance lower than the resistance of the wires in the prior art, which reduces the energy consumption and increases the efficiency of the semiconductor device.

Accordingly, the present invention also provides a device with packaged chips, which is packaged by the chip packaging method mentioned above. As shown in FIG. 12, the device includes: a substrate 500, on which a plurality of second bonding layers 501 are disposed at intervals; a plurality of chips 100, each arranged on a corresponding one of the second bonding layers 501; a plastic packaging layer 203, disposed over the substrate 500 and the second bonding layers 501 and laterally surrounding the chips 100; an insulating layer 301 over both the plastic packaging layer 203 and the chips 100; openings formed in the insulating layer 301, each terminating at one of the chips 100; and a metal conducting layer 302 and an interconnect circuitry 303 formed in the openings. The device may further include: a second insulating layer 304 over the insulating layer 301 and the interconnect circuitry 303; and openings 305 in the second insulating layer 304.

According to the device of the present invention, the distance between the chips 100 can be greatly reduced to 50 µm, while the distance between the chips in the prior art is 500 µm. As a result, the size of the terminal products can be reduced, which facilitates miniaturization of the terminal products. Moreover, in the device according to the present invention, metal is applied to substitute the wires in the prior art, which lower the resistance between chips to a great extent. The resistance is lowered to 30%-50% of that of the conventional wires, so that the energy consumption is reduced and the efficiency of the semiconductor device is increased.

In summary, according to the chip packaging method and the device of the present invention, the plastic packaged chips are formed by arranging a plurality of chips at intervals onto the support plate attached thereon with a first bonding layer, performing a plastic packaging process to form a plastic packaging layer on the support plate, and filling the gaps between the plurality of chips with the plastic packaging layer, so that the distances between the chips can be reduced, and finally the size of the terminal products is reduced, which facilitates miniaturization of the terminal products. According to the present invention, metal is sputtered to form the metal seed layer into the openings of the insulating layer, and the metal seed layer is electroplated so that a metal conducting layer is formed and also the interconnect circuitry between the chips is formed. As a result, the interconnect resistance of the metal in the metal conducting layer is lower than that of the wires in the prior art. Therefore, the energy consumption is reduced and the efficiency of the semiconductor device is improved.

What is claimed is:

1. A chip packaging method, comprising:
   (S01) providing a support plate having a first bonding layer attached thereon;
   (S02) placing a plurality of chips onto the first bonding layer at intervals;
   (S03) performing a plastic packaging process to form a plastic packaging layer filling gaps between the chips over the support plate, so that plastic packaged chips are formed;
   (S04) removing the support plate and the first bonding layer;
   (S05) forming an insulating layer over the plastic packaged chips, forming openings in the insulating layer, and forming a metal conducting layer and an interconnect circuitry in the openings; and
   (S06) dicing the plastic packaged chips into a plurality of modules;
   wherein each of the gaps between adjacent ones of the chips on the first bonding layer is greater than or equal to 50 µm.

2. The method of claim 1, further comprising:
   (S07) providing a substrate having a plurality of metal pads formed thereon, each metal pad corresponding to a respective one of the chips in the modules;
   (S08) forming second bonding layers on the metal pads; and
   (S09) bonding each of the modules, at a side thereof far away from the insulating layer, to the substrate.

3. The method of claim 2, wherein the second bonding layers are made of a tin-based solder material, and wherein in step S09, the module is placed on the substrate by a surface mount system and then processed in a reflow oven so that the module is bonded, at the side thereof far away from the insulating layer, to the substrate.

4. The method of claim 2, wherein the second bonding layers are made of a sintering material, and wherein in step S09, the module is placed on the substrate by a surface mount system and then processed in a sintering furnace so that the module is bonded, at the side thereof far away from the insulating layer, to the substrate.

5. The method of claim 2, wherein the second bonding layers are made of an electrically conductive adhesive, and wherein in step S09, the module is placed on the substrate by a surface mount system and then baked so that the module is bonded, at the side thereof far away from the insulating layer, to the substrate.

6. The method of claim 2, wherein the substrate is made of a metal which is both electrically and thermally conductive.

7. The method of claim 1, wherein the support plate is circular, square or rectangular.

8. The method of claim 1, wherein in step S03, the plastic packaging process is a high-pressure packaging process or injection molding process, and wherein the plastic packaging layer is made of epoxy resin.

9. The method of claim 1, wherein the plastic packaging layer is as thick as the chips.

10. The method of claim 1, wherein the plastic packaging layer is thinner than the chips, and wherein the plastic packaging layer has a surface close to the substrate, which is lower than a surface of each of the chips close to the substrate by a distance ranging from 2 µm to 10 µm.

11. The method of claim 1, wherein each of the chips has a front side provided with a circuit and has a back side provided with an electrode, and each chip is placed with the back side thereof in contact with the first bonding layer.

12. The method of claim 11, wherein in step S05, the step of forming the metal conducting layer and the interconnect circuitry comprises:
   sputtering a metal seed layer on the insulating layer;
   electroplating portions of the metal seed layer within the openings; and
   removing the metal seed layer except for the electroplated portions.

13. A device with packaged chips, formed by a method comprising:
   (S01) providing a support plate having a first bonding layer attached thereon;
   (S02) placing a plurality of chips onto the first bonding layer at intervals;

(S03) performing a plastic packaging process to form a plastic packaging layer filling gaps between the chips over the support plate, so that plastic packaged chips are formed;

(S04) removing the support plate and the first bonding layer;

(S05) forming an insulating layer over the plastic packaged chips, forming openings in the insulating layer, and forming a metal conducting layer and an interconnect circuitry in the openings;

(S06) dicing the plastic packaged chips into a plurality of modules; and the device comprising:

a substrate, on which a plurality of second bonding layers are disposed at intervals;

the plurality of chips, each arranged on a corresponding one of the second bonding layers;

the plastic packaging layer, disposed on the substrate and laterally surrounding the chips;

the insulating layer over both the plastic packaging layer and the chips;

the openings formed in the insulating layer, each terminating at one of the chips; and the metal conducting layer and interconnect circuitry, formed in the openings;

wherein each of the gaps between adjacent ones of the chips on the first bonding layer is greater than or equal to 50 μm.

14. The device of claim 13, wherein the method further comprises:

(S07) providing a substrate having a plurality of metal pads formed thereon, each metal pad corresponding to a respective one of the chips in the modules;

(S08) forming the second bonding layers on the metal pads; and (S09) bonding each of the modules, at a side thereof far away from the insulating layer, to the substrate.

15. The device of claim 14, wherein the second bonding layers are made of a tin-based solder material, and wherein in step S09, the module is placed on the substrate by a surface mount system and then processed in a reflow oven so that the module is bonded, at the side thereof far away from the insulating layer, to the substrate.

16. The device of claim 14, wherein the second bonding layers are made of a sintering material, and wherein in step S09, the module is placed on the substrate by a surface mount system and then processed in a sintering furnace so that the module is bonded, at the side thereof far away from the insulating layer, to the substrate.

17. The device of claim 14, wherein the second bonding layers are made of an electrically conductive adhesive, and wherein in step S09, the module is placed on the substrate by a surface mount system and then baked so that the module is bonded, at the side thereof far away from the insulating layer, to the substrate.

18. The device of claim 14, wherein the substrate is made of metal which is both electrically and thermally conductive.

19. The device of claim 13, wherein the support plate is circular, square or rectangular.

* * * * *